United States Patent
Sarma (10) Patent No.: US 7,223,612 B2
(45) Date of Patent: May 29, 2007

(54) ALIGNMENT OF MTJ STACK TO CONDUCTIVE LINES IN THE ABSENCE OF TOPOGRAPHY

(75) Inventor: Chandrasekhar Sarma, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 374 days.

(21) Appl. No.: 10/899,253

(22) Filed: Jul. 26, 2004

(65) Prior Publication Data

US 2006/0017180 A1    Jan. 26, 2006

(51) Int. Cl.
  H01L 21/00   (2006.01)
  H01L 23/544  (2006.01)
  H01L 21/76   (2006.01)

(52) U.S. Cl. .......................... 438/3; 438/401; 438/462; 438/692; 257/797; 257/E21.546; 257/E21.665; 257/E23.179

(58) Field of Classification Search .................... 438/3, 438/393, 401; 257/797, E21.665, E23.179
See application file for complete search history.

(56) References Cited

U.S. PATENT DOCUMENTS

| | | |
|---|---|---|
| 4,592,132 A | 6/1986 | Lee et al. |
| 4,657,629 A | 4/1987 | Bigelow |
| 5,002,902 A | 3/1991 | Watanabe |
| 5,492,607 A | 2/1996 | Yap |
| 5,503,962 A | 4/1996 | Caldwell |
| 5,663,099 A | 9/1997 | Okabe et al. |
| 5,738,961 A | 4/1998 | Chen |
| 5,786,260 A | 7/1998 | Jang et al. |
| 5,935,764 A | 8/1999 | Kakehashi |
| 5,958,800 A | 9/1999 | Yu et al. |
| 6,010,945 A * | 1/2000 | Wu ............................. 438/401 |
| 6,043,133 A * | 3/2000 | Jang et al. .................. 438/401 |
| 6,133,111 A | 10/2000 | Sur et al. |
| 6,146,969 A | 11/2000 | Tan et al. |
| 6,174,737 B1 | 1/2001 | Durlam et al. |
| 6,183,614 B1 | 2/2001 | Fu |

(Continued)

FOREIGN PATENT DOCUMENTS

DE    102 27 211 A 1    2/2003

OTHER PUBLICATIONS

Bajaj, R., et al., "Manufacturability Considerations and Approaches for Development of a Copper CMP Process," 1999 VMIC Conference, pp. 144-151, 1999 IMIC 109/99/0144 (c).

(Continued)

Primary Examiner—B. William Baumeister
Assistant Examiner—Igwe U. Anya
(74) Attorney, Agent, or Firm—Slater & Matsil, L.L.P.

(57) ABSTRACT

A scheme for aligning opaque material layers of a semiconductor device. Alignment marks are formed in a via level of the semiconductor device. The alignment marks are formed using a separate lithography mask, and may have about the same length as vias formed in the via layer. The alignment marks comprise trenches that are not filled with material and are not exposed to a CMP process. An opaque material layer is deposited, and depressions are formed in the opaque material layer over the alignment mark trenches. The depressions in the opaque material layer are used to align a lithography process to open the opaque material layer over alignment marks in an underlying metallization layer. The alignment marks in the metallization layer are then used to align the lithography process used to pattern the opaque material layer.

34 Claims, 4 Drawing Sheets

U.S. PATENT DOCUMENTS

| | | |
|---|---|---|
| 6,284,551 B1 | 9/2001 | Cho et al. |
| 6,319,767 B1 | 11/2001 | Cha et al. |
| 6,346,454 B1 | 2/2002 | Sung et al. |
| 6,420,261 B2 | 7/2002 | Kudo |
| 6,447,634 B1 | 9/2002 | Zahorik et al. |
| 6,555,925 B1 | 4/2003 | Higashi et al. |
| 6,566,157 B2* | 5/2003 | Ohtaka ............ 438/48 |
| 6,774,452 B1* | 8/2004 | Ramkumar et al. ....... 257/506 |
| 6,780,775 B2 | 8/2004 | Ning |
| 6,858,441 B2* | 2/2005 | Nuetzel et al. ............ 438/3 |
| 6,979,526 B2* | 12/2005 | Ning ............ 430/314 |
| 2001/0001077 A1* | 5/2001 | Tan et al. ............ 438/401 |
| 2001/0040778 A1 | 11/2001 | Abraham et al. |
| 2002/0009876 A1 | 1/2002 | Wege et al. |
| 2002/0096775 A1 | 7/2002 | Ning |
| 2002/0098705 A1 | 7/2002 | Low |
| 2002/0098707 A1 | 7/2002 | Ning |
| 2002/0100978 A1 | 8/2002 | Tomita et al. |
| 2002/0153551 A1 | 10/2002 | Wong et al. |
| 2003/0017707 A1 | 1/2003 | Yamashita et al. |
| 2003/0224260 A1 | 12/2003 | Ning |
| 2004/0043579 A1 | 3/2004 | Nuetzel et al. |
| 2004/0102014 A1* | 5/2004 | Ning et al. ............ 438/393 |
| 2005/0079683 A1 | 4/2005 | Sarma et al. |
| 2006/0141737 A1* | 6/2006 | Gaidis ............ 438/401 |

OTHER PUBLICATIONS

Raghavan, S., et al., "Electrochemical Behavior of Copper and Tantalum in Silica Slurries Containing Hydroxylamine," 1999 VMIC Conference, pp. 619-626, 1999 IMIC 109/99/0619 (c).

Wang, C.T., et al., "Pad Wear Analysis in CMP," 1999 VMIC Conference, pp. 267-269, 1999 VMIC 109/99/0267 (c).

Wong, K.K.H., et al., "Metallization by Plating for High-Performance Multichip Modules," IBM J. Res. Develop., Sep. 1998, pp. 587-596, vol. 42, No. 5.

* cited by examiner

ALIGNMENT OF MTJ STACK TO CONDUCTIVE LINES IN THE ABSENCE OF TOPOGRAPHY

TECHNICAL FIELD

The present invention relates generally to the fabrication of semiconductor devices, and more particularly to the alignment of opaque material layers of semiconductor devices.

BACKGROUND

Generally, semiconductor devices are fabricated by deposited a plurality of insulating, conductive and semiconductive material layers over a substrate or workpiece, and patterning the various material layers to form integrated circuits and electronic elements thereon. Each layer is typically aligned to an underlying material layer using alignment marks. The tools used to fabricate semiconductor devices visually locate the alignment marks, the position of which are programmed into the tools.

If a material layer is transparent or translucent, as many insulating material layers and semiconductive material layers are, as well as photoresists or hard masks that are used as masks to pattern material layers, the tool can "see through" the insulating layer, semiconductor material layer or photoresist and locate the alignment marks. However, many conductive layers are optically opaque, and thus additional steps must be taken to align them.

One way to align optically opaque layers is to form recessed alignment marks in an underlying material layer, by forming them simultaneously while conductive lines or vias are formed in a damascene process, removing a portion of the material from the alignment marks, and depositing the opaque layer over the material layer with recessed alignment marks. In theory, the alignment marks would then be visible on the top surface of the opaque layer, e.g., as depressions.

However, if the recessed alignment marks are formed in a damascene formed layer, such as conductive lines or vias formed in an insulating layer, if the insulating layer is subjected, to a chemical mechanical polish (CMP) process, (as is typical to remove excess conductive material from the top surface of the insulating layer to form the conductive lines or vias) the edges of the alignment marks become eroded by the CMP process, and thus the edges are not sharp. This makes it difficult to use the alignment marks to align a subsequently deposited opaque layer, because the depressions transferred to the topography of the opaque layer are not as visible on the top surface of the opaque layer. The presence of clearly defined alignment marks is required for extremely tight alignment tolerance, as dictated by device performance.

There are other problems with using a CMP process over recessed alignment marks. Debris from the CMP slurry can become trapped in the alignment marks, making the topography of a subsequently deposited opaque layer less visible, or not visible at all, particularly if the alignment marks are shallow. In addition, the deposition of opaque layers over such alignment marks give rise to jagged edges in the depressions in the topography of the opaque layer over the alignment marks, making the depressions unusable for alignment. Furthermore, the CMP slurry materials left in the alignment marks can react with some materials used in subsequent etch processes, such as chlorine or fluorine, causing the alignment marks to explode, making them unusable as alignment marks. This creates foreign materials all over the chip, leads to delamination of layers and thus adversely affects the device performance and reduces yield.

A recent development in semiconductor memory devices are referred to as resistive memory devices or magnetic memory devices, such as magnetic random access memory (MRAM) devices. In MRAM devices, the spin of electrons, rather than the charge, is used to indicate the presence of a "1" or "0." MRAM devices comprise conductive lines (wordlines and bitlines) positioned in a different direction, e.g., perpendicular to one another in different metal layers, the conductive lines sandwiching a resistive memory element comprising a magnetic stack or magnetic tunnel junction (MTJ), which functions as a magnetic memory cell. A current flowing through one of the conductive lines generates a magnetic field around the conductive line and orients the magnetic polarity into a certain direction along the wire or conductive line. A current flowing through the other conductive line induces the magnetic field and can partially turn the magnetic polarity, also. Digital information, represented as a "0" or "1," is storable in the alignment of magnetic moments. The resistance of the magnetic memory cell depends on the moment's alignment. The stored state is read from the magnetic memory cell by detecting the component's resistive state.

The MTJ's of MRAM devices typically comprise a first magnetic layer, a tunnel insulator formed over the first magnetic layer, and a second magnetic layer formed over the tunnel insulator. The first magnetic layer and the second magnetic layer each typically comprise one or more layers of magnetic materials and/or metal materials, for example. The first magnetic layer may comprise a seed layer of Ta and/or TaN, an antiferromagnetic layer such as PtMn disposed over the seed layer, and one or more magnetic material layers comprising CoFe, NiFe, CoFeB, Ru, other materials, or combinations thereof disposed over the antiferromagnetic layer, as examples. The first magnetic layer is also referred to as a fixed layer because its magnetic polarity is fixed. The second magnetic layer may comprise one or more magnetic material layers comprising CoFe, NiFe, CoFeB, other magnetic material layers, or combinations thereof, as examples. The second magnetic layer is also referred to as a free layer because its magnetic polarity changes when the magnetic memory cell is written to. The tunnel insulator may comprise a thin insulator such as $Al_2O_3$ or semiconductive materials, as examples.

Copper is often used for the material of conductive lines of MRAM devices, because of its high conductivity and low resistance. However, copper is difficult to etch, and damascene processes using CMP processes are often used to form copper lines and metallization alignment marks in conductive line and via levels. Furthermore, because the first magnetic layer and second magnetic layer of MTJ's comprise metals, they are opaque.

What is needed in the art are improved methods of aligning the opaque magnetic stacks or MTJ's of MRAM devices to underlying material layers that may be formed by CMP, such as the wordlines, bitlines, or conductive via levels of the MRAM array.

SUMMARY OF THE INVENTION

These and other problems are generally solved or circumvented, and technical advantages are generally achieved, by preferred embodiments of the present invention, which provide methods of forming alignment marks in an underlying material layer, before depositing an opaque material. The alignment marks preferably extend into one or more insulating layers. The alignment marks are formed in an alignment mark region of a chip at the edge or kerf of the chip proximate the scribe line in a via layer inter-level dielectric (ILD) layer disposed over a metallization layer of a semiconductor device. The alignment marks may extend into the ILD layer of the underlying metallization layer. The alignment marks are formed using a separate lithography mask. The alignment marks are not formed at the same time as other device layers such as vias in the via layer. This decouples the process issues associated with formation of device layers that include alignment marks. Preferably the alignment marks are formed as deep as vias are formed in the via layer in one embodiment. The separate lithography mask for the novel alignment mark only has alignment marks in the kerf of each chip or die. The alignment marks may not be part of the finished product, as they may be removed during the die singulation process. The alignment marks are not exposed to a CMP process, and may be used to align the lithography process for a subsequently deposited opaque layer, such as a magnetic stack of an MTJ.

In accordance with a preferred embodiment of the present invention, a method of manufacturing a semiconductor device includes providing a workpiece, the workpiece including a first region and a second region, forming a first insulating layer over the workpiece, and forming at least one first alignment mark over the first region of the workpiece and a plurality of first conductive lines over the second region of the workpiece within the first insulating layer, the at least one first alignment mark being filled with a conductive material. A second insulating layer is formed over the at least one first alignment mark, the plurality of first conductive lines, and the first insulating layer, and a conductive via is formed in the second insulating layer over the second region of the workpiece using a first lithography mask. At least one second alignment mark is formed within at least the second insulating layer over the first region of the workpiece using a second lithography mask, the second lithography mask being different from the first lithography mask, the at least one second alignment mark comprising a trench having a bottom and sidewalls. An opaque material layer is deposited over the at least one second alignment mark and the second insulating layer, the opaque material layer lining the bottom and sidewalls of the trench of the at least one second alignment mark, leaving a depression in the opaque material layer over each at least one second alignment mark. A first masking layer is deposited over the opaque material layer, and the first masking layer is patterned using a lithography mask or tool, removing the first masking layer from over the at least one first alignment mark, using the depression over the at least one second alignment mark to align the lithography mask or tool used to pattern the first masking layer over the opaque material layer. The opaque material layer is removed from over the at least one first alignment mark using the first masking layer as a mask, and the first masking layer is removed. A second masking layer is deposited over the opaque material layer and the at least one first alignment mark, the second masking layer is patterned with a pattern for the opaque material layer using the at least one first alignment mark for alignment, and the opaque material layer is patterned using the second masking layer as a mask.

In accordance with another preferred embodiment of the present invention, a method of manufacturing a magnetic memory device includes providing a workpiece, the workpiece including a plurality of die regions, each die region comprising an alignment mark region at the edges thereof, and an array region disposed within the alignment mark region. A first insulating layer is formed over the workpiece, and at least one first alignment mark is formed over the alignment mark region of the workpiece. A plurality of first conductive lines is formed over the array region of the workpiece within the first insulating layer, the at least one first alignment mark being filled with a conductive material. A second insulating layer is formed over the at least one first alignment mark, the plurality of first conductive lines, and the first insulating layer. A conductive via is formed in the second insulating layer over the array region of the workpiece using a first lithography mask. At least one second alignment mark is formed within at least the second insulating layer over the alignment mark region of the workpiece using a second lithography mask, the second lithography mask being different from the first lithography mask, the at least one second alignment mark comprising a trench having a bottom and sidewalls, and the at least one second alignment mark not being disposed over the at least one first alignment mark. A first magnetic stack is deposited over the at least one second alignment mark and the second insulating layer, the first magnetic stack lining the bottom and sidewalls of the trench of the at least one second alignment mark, leaving a depression in the first magnetic stack over the at least one second alignment mark. A first masking layer is deposited over the first magnetic stack, and the first masking layer is patterned using a lithography mask or tool, removing the first masking layer from over the at least one first alignment mark, using the depression over the at least one second alignment mark to align the lithography mask or tool used to pattern the first masking layer over the first magnetic stack. The first magnetic stack is removed from over the at least one first alignment mark using the first masking layer as a mask, and the first masking layer is removed. A second masking layer is deposited over the first magnetic stack and the at least one first alignment mark, the second masking layer is patterned with a pattern for the first magnetic stack using the at least one first alignment mark for alignment, and the first magnetic stack is patterned using the second masking layer as a mask.

In accordance with yet another preferred embodiment of the present invention, a semiconductor device includes a workpiece, the workpiece including a first region and a second region, and a first insulating layer disposed over the workpiece. At least one first alignment mark is disposed over the first region of the workpiece and a plurality of first conductive lines is disposed over the second region of the workpiece within the first insulating layer. The at least one first alignment mark is filled with a conductive material. A second insulating layer is disposed over the at least one first alignment mark, the plurality of first conductive lines, and the first insulating layer. At least one second alignment mark is disposed within the second insulating layer and a portion of the first insulating layer over the first region of the workpiece, the at least one second alignment mark comprising a trench having a bottom and sidewalls.

Advantages of embodiments of the present invention include providing improved methods of patterning opaque material layers of semiconductor devices. Because the alignment marks formed in the via level insulating layer are not subjected to a CMP process and are relatively deep, e.g., 1000 Angstroms or more, the depressions formed in the opaque material layer are clearly visible and advantageously, can be used for alignment for a lithography process to expose alignment marks in an underlying metallization layer. The exposed alignment marks in the metallization layer may then be used to align the lithography process to pattern the opaque material layer. The novel alignment marks described herein are formed in the kerf region of each die on a semiconductor device, and may be removed during the singulation process, or may be left remaining in the finished product. A separate lithography mask is used to pattern the alignment marks, e.g., a different mask is used to pattern conductive vias within the via level insulating layer. The alignment marks preferably have a greater length than the vias formed in the via layer in one embodiment, e.g., they may extend partially into the underlying insulating layer of the metallization layer. The alignment marks are not exposed to a CMP process, and thus the topography of the alignment marks remains intact and has sharp and clear edges, so that highly defined depressions form in the opaque material layer, which may comprise a magnetic stack of an MRAM device, for example. Embodiments of the present invention are particularly beneficial when used with semiconductor devices having a top surface with no topography, or very little topography (e.g., having shallow features or alignment marks).

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an MRAM device. The invention may also be applied, however, to other resistive memory devices or semiconductor devices with opaque material layers.

Figure 1:
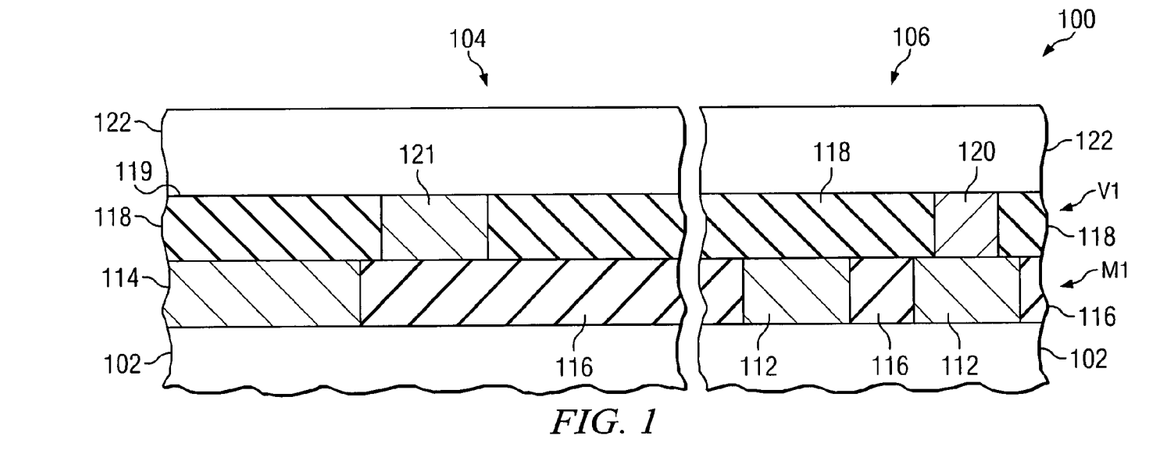
FIGS. 1 through 3 show cross-sectional views of an MRAM device at various stages of manufacturing in accordance with a preferred embodiment of the present invention.

Embodiments of the present invention provide novel methods of forming alignment marks for the opaque MTJ stack of an MRAM device. With reference now to FIG. 1, there is shown a cross-sectional view of a semiconductor device 100 (also referred to herein as a die 100) comprising a workpiece 102. The workpiece 102 may include a semiconductor substrate comprising silicon or other semiconductor materials covered by an insulating layer, for example. The workpiece 102 may also include other active components or circuits formed in a front end of line (FEOL), not shown. The workpiece 102 may comprise silicon oxide over single-crystal silicon, for example. The workpiece 102 may include other conductive layers or other semiconductor elements, e.g. transistors, diodes, etc. Compound semiconductors, GaAs, InP, Si/Ge, or SiC, as examples, may be used in place of silicon. For example, the workpiece 102 may include component regions or various circuit elements formed therein. The workpiece 102 will have a plurality of die 100 formed thereon, to be described further herein, as shown in a top view in FIG. 4A.

Figure 4A:
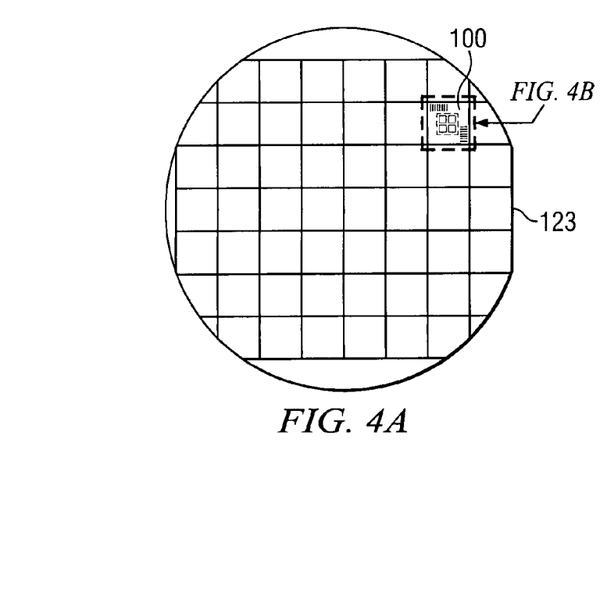
FIG. 4A shows a top view of a semiconductor wafer or workpiece having a plurality of die disposed thereon.
Figure 4B:
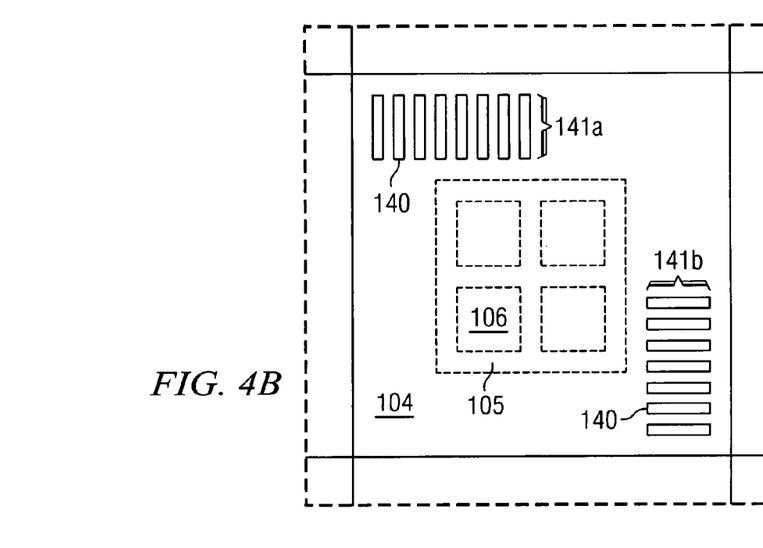
FIG. 4B shows a more detailed view of one die of the workpiece shown in FIG. 4A, illustrating the locations of the alignment mark region and the array regions of an MRAM device.

Each die area 100 of the workpiece 102 includes an alignment mark region 104 and an array region 106, as shown in a cross-sectional view in FIG. 1 and in a top view in FIGS. 4A and 4B. The workpiece 102 may include a plurality of individual semiconductor devices or die 100. The alignment mark region 104 preferably is disposed at the edges of each individual die (see FIG. 4B). On an MRAM device, there may be a plurality of array regions 106. For example, four array regions 106 are shown; however, there may be 32 array regions 106 on a single die 100 (although there may be other numbers of array regions 106, depending on the size of the magnetic memory device). The workpiece 102 may also include other regions, such as a peripheral support circuitry region 105 and/or other regions, for example.

Referring again to FIG. 1, a first insulating layer 116 is deposited over the workpiece 102. The first insulating layer 116 preferably comprises silicon dioxide and may alternatively comprise low dielectric constant materials, other insulating materials, or combinations or multiple layers thereof, as examples. The first insulating layer 116 may alternatively comprise other materials, for example. The first insulating layer 116 may comprise a thickness of a few thousand Angstroms, e.g., 3000 Angstroms or less, although alternatively, the first insulating layer 116 may comprise other thicknesses.

A plurality of first conductive lines 112 are formed within the first insulating layer 116 in the array region 106'. The first conductive lines 112 may include an optional conductive liner (not shown), and a conductive material disposed over and filling the liner, for example. Alternatively, the first conductive lines 112 may comprise a single material, or two or more materials, for example. The conductive material may comprise copper, aluminum, or combinations thereof, as examples, although alternatively, the conductive material may comprise other conductive materials. The first conductive lines 112 may be formed in a damascene process, for example. Alternatively, the first conductive lines 112 may be formed using a subtractive etch process, for example. The first conductive lines 112 function as wordlines or bitlines of an MRAM device 100, for example, and are used to access each MTJ (not shown in FIG. 1; see FIG. 7 at 124).

At least one first alignment mark 114 is formed in the first insulating layer 116 in the alignment mark region 104, as shown. The first alignment marks 114 preferably comprise the same material as the first conductive lines 112, e.g., and preferably comprise a conductive material. The first alignment marks 114 preferably comprise the same depth within the first insulating layer 116 as the first conductive lines 112, as shown, or alternatively, the first alignment marks 114 may comprise a depth within the first insulating layer 116 that is less than the depth of the first conductive lines 112 within the first insulating layer 116. The first alignment marks 114 are preferably formed using the same photolithography mask and are preferably formed during the same etch process that the first conductive lines 112 are formed in, for example. The first alignment marks 114 may comprise alignment marks for a metallization layer (e.g., MI or other metallization level) of the device 100, for example. The first alignment marks 114 comprise one or more sets of alignment marks, for example (although only one first alignment mark 114 is shown in the figures).

The first alignment marks 114 and first conductive lines 112 are preferably formed simultaneously in a single damascene process. For example, the patterns for the alignment marks 114 and the first conductive lines 112 are formed in the first insulating layer 116, and a conductive material is deposited over the patterns to fill the patterns. Excess conductive material is removed from over the top surface of the first insulating layer 116, forming the alignment marks 114 and the first conductive lines 112 and leaving a planar top surface.

Second alignment marks 140 (see FIG. 2) will be formed in accordance with an embodiment of the present invention in a via layer V1 disposed over the metallization layer M1. The second alignment marks 140 are used for alignment when opening an opaque material layer over the first alignment marks 114, so that the first alignment marks 114 may be used for alignment when patterning the opaque material layer, to be described further herein.

Referring again to FIG. 1, a second insulating layer 118 is deposited over the first insulating layer 116, the first conductive lines 112, and the first alignment marks 114. The second insulating layer 118 may comprise silicon nitride or other insulators such as silicon dioxide or low-k material, although the second insulating layer 118 may alternatively comprise other insulating materials, as examples. The second insulating layer 118 may comprise an inter-level dielectric (ILD) for a via metallization layer (e.g., V1 or other via level) in which vias 120 are formed to make contact to underlying first conductive lines 112 in the array region 106, as shown. The second insulating layer 118 may comprise a thickness of a few thousand Angstroms, e.g., 3000 Angstroms or less, as examples, although alternatively, the second insulating layer 118 may comprise other thicknesses. In one embodiment, the second insulating layer 118 preferably comprises a thickness of about 1500 Angstroms or less, for example. The second insulating layer 118 is preferably transparent or translucent.

The vias 120 may be formed within the second insulating layer 118 in the array region 106 using a damascene process, for example. The second insulating layer 118 is patterned with holes or trenches for the vias 120. The vias 120 are filled with a conductive material such as copper or tungsten, as examples, although the vias 120 may alternatively comprise other conductive materials. The vias 120 may include a liner, not shown. The vias 120 may alternatively be formed using a subtractive etch process, followed by the deposition of the second insulating layer 118 between the vias 120, for example.

Optional third alignment marks 121 may be formed in the alignment mark region 104 simultaneously with the formation of the vias 120, e.g., in a single damascene process. The third alignment marks 121 may comprise one or more sets of alignment marks, for example, although only one second alignment mark 121 is shown in the figures. The third alignment marks 121 are not required in accordance with an embodiment of the present invention. The third alignment marks 121 may comprise alignment marks that were once only partially filled with conductive material and at one point had a topography with respect to a top surface of the second insulating layer 118, but due to a CMP process, most or all of the topography has been removed by removal of the excess second insulating layer 118, in the CMP step, for example.

A CMP process may be used to remove excess conductive material from over the top surface of the second insulating layer 118, to form the vias 120 and the optional third alignment marks 121, for example. Thus, the top surfaces 119 of the second insulating layer 118, vias 120 and the third alignment marks 121 are substantially coplanar. Because the top surface of the second insulating layer 118 is planar, and in particular, because the third alignment marks 121 do not have a topography within the second insulating layer 118, there is no topography that could be used for alignment of an opaque material layer, if one were to be deposited at this stage of the manufacturing process.

Figure 2:
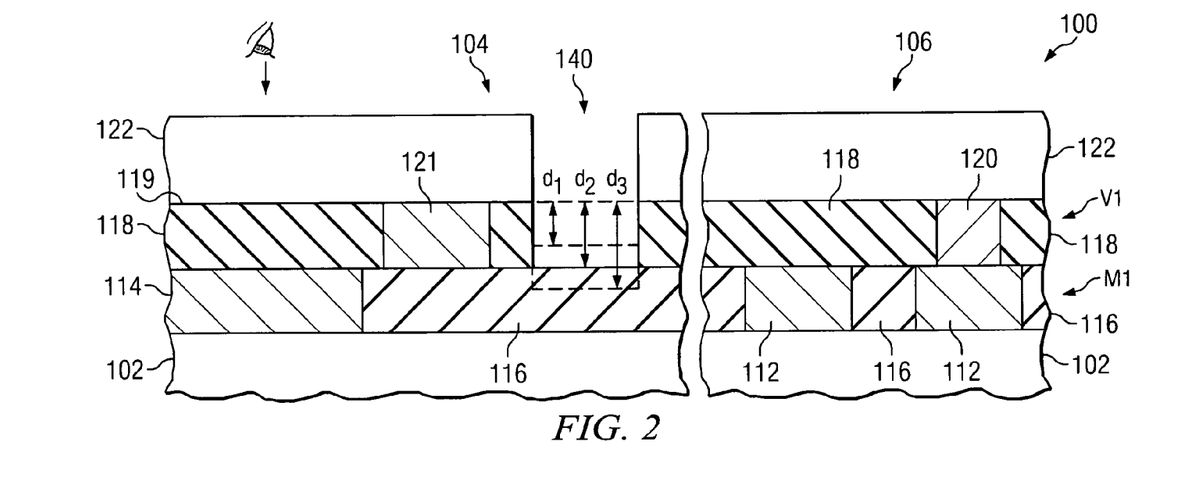
Figure 3:
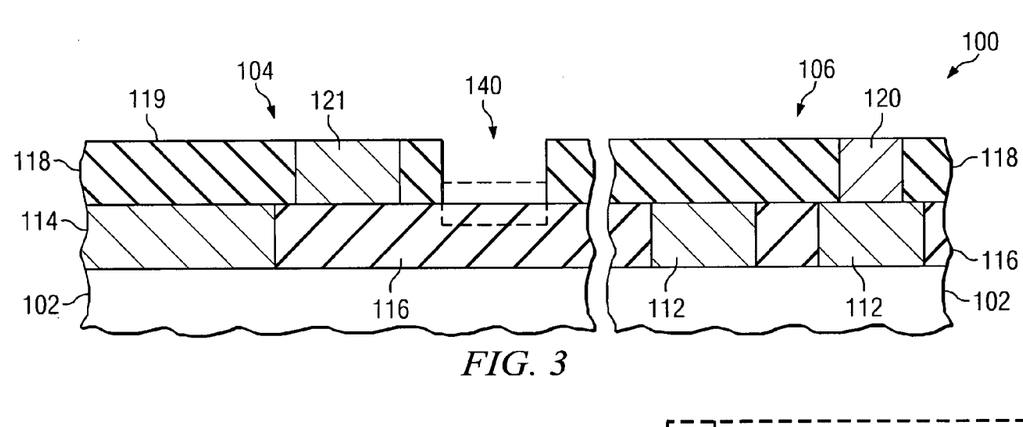

In accordance with a preferred embodiment of the present invention, next, at least one second alignment mark 140 is formed within at least the second insulating layer 118, as shown in FIGS. 1 through 3. First, a mask 122 is deposited over the second insulating layer 118 and vias 120, as shown in FIG. 2, and the mask 122 is patterned with the desired second alignment mark pattern, as shown in FIG. 3. The mask 122 may comprise a photoresist, a hard mask, or combinations thereof, as examples, although alternatively, the mask 122 may comprise other materials.

The mask 122 is patterned to form at least one second alignment mark 140 (also referred to herein as "second alignment marks 140") in at least the second insulating layer 118. The mask 122 is aligned to alignment marks 114 through the second insulating layer 118. The mask 122 may be patterned using a lithography mask, or may be directly patterned using electron beam lithography (EBL) or other direct patterning method, as examples. The mask 122 is used to mask portions of the second insulating layer 118 while at least the second insulating layer 118 is patterned, e.g., using an etch process, with at least one second alignment mark 140, as shown in FIG. 2. The at least one second alignment mark 140 may comprise a plurality of second alignment marks 140 in a preferred embodiment (not shown in FIG. 2; see FIG. 4B).

In one embodiment, the second alignment marks 140 extend through a substantial portion of the thickness of the second insulating layer 118. For example, the second alignment marks 140 preferably extend through at least half the thickness of the second insulating layer 118, as shown in phantom at $d_1$ in FIG. 2. Depth $d_1$ of the second alignment marks 140 preferably comprises at least 1000 Angstroms in one embodiment.

In another embodiment, the second alignment marks 140 extend through the entire thickness of the second insulating layer 118, as shown in phantom at $d_2$. For example, if the second insulating layer 118 comprises a thickness of about 1500 Angstroms, then preferably in this embodiment, the second alignment marks 140 comprise a depth of about 1500 Angstroms.

In yet another embodiment, the second alignment marks 140 extend through the entire thickness of the second insulating layer 118 and also through a portion of the first insulating layer 116, as shown in phantom at $d_3$. Depth $d_3$ of the second alignment marks 140 preferably comprises at least 2000 Angstroms in one embodiment.

After the second alignment marks 140 are formed in at least the second insulating layer 118, the mask 122 is then removed, leaving the structure shown in FIG. 3. The material layers 118, 120, and 121 are substantially planar, with the exception of the second alignment mark 140 formed in the alignment mark region 104, at this stage of the manufacturing process. The second alignment marks 140 preferably comprise trenches having sidewalls and a bottom surface, as shown. The second alignment mark 140 trench is preferably devoid of any materials.

Preferably, in one embodiment, in order to etch or form the second alignment mark 140 within the first insulating layer 116, the second alignment marks 140 are not formed over the first alignment mark 114 within the metallization layer M1. Otherwise, the conductive material of the alignment mark 114 would prevent the etching or formation of the second alignment mark 140 within a portion of the first insulating layer 116, in one embodiment, for example. Also, likewise, preferably the second alignment marks 140 are not formed over the optional third alignment marks in the via layer V1, for example. However, the second alignment mark 140 may alternatively be formed over a first alignment mark 114 or a third alignment mark 121, in another embodiment.

Although only one second alignment mark 140 is shown in the figures, preferably, at least one alignment mark 140 is formed. For example, a plurality of second alignment marks 140 may be formed in a pattern in the alignment mark region 104. For example, one or more sets of second alignment marks 140 may be formed, in accordance with an embodiment of the present invention.

FIG. 4A shows a top view of a workpiece comprising a plurality of semiconductor devices 100 formed thereon. The workpiece may have at least one flat edge 123 that is used for mechanical alignment within a chuck, for example (although first alignment marks 114 or other underlying alignment marks, not shown, may also be used for more exact alignment within a chuck or tool such as a stepper, for example). For an MRAM device, there may be 60 or more individual die or devices 100 formed on a single workpiece 102, as an example, although other numbers of die 100 may be formed.

FIG. 4B shows a more detailed view of a single die 100 shown in FIG. 4A. The alignment mark region 104 is preferably-located in the kerf or edge region of the die 100. The width of the alignment mark region 104 at the die kerf may comprise about 200 μm, as an example, although the alignment mark region 104 may alternatively comprise other dimensions. A first set 141a and a second set 141b of second alignment marks 140 may be formed in the alignment mark region 104, as shown. Each set 141a and 141b may comprise about 10 or more second alignment marks 140, in one embodiment. For example, a set 141a or 141b may comprise 11, 13 or other number of second alignment marks 140. Each second alignment mark 140 preferably comprises a width of about 2 μm or less and a length of about 60 μm or less, although alternatively, the second alignment marks 140 may comprise other dimensions.

Preferably, one set 141a is formed along the top or bottom of the die 100, and the other set 141b is formed along the left edge or right edge of the die 100. For example, one set 141a may be formed at a top edge of the alignment mark region 104, as shown. Alternatively, set 141a may be formed at the bottom edge of the alignment mark region 104 (not shown). Similarly, set 141b may be formed along the right side edge of the die within the alignment mark region 104, as shown, or alternatively, set 141b may be formed along the left side edge of the die (not shown). The top or bottom edge set 141a of alignment marks 140 is preferably arranged with the long side of the alignment marks 140 positioned vertically, and the side edge set 141b of alignment marks 140 is preferably arranged with the long side of the alignment marks 140 positioned horizontally, as shown. The number and arrangement of the second alignment marks 140 according to embodiments of the present invention is a function of the particular lithography equipment and tools used to manufacture the semiconductor device 100, for example.

The novel second alignment marks 140 may be used to provide access to the first alignment marks 114 within the metallization layer M1, for alignment of the lithography process used to pattern opaque material layers, which will be described next. An opaque material layer 124 is deposited over the second insulating layer 118, the conductive vias 120 in the array region, and over the at least one second alignment mark 140 and the optional third alignment marks 121 in the alignment mark region 104, as shown in a cross-sectional view in FIG. 5. The opaque material layer 124 may comprise a magnetic stack, for example, that is used to form MTJ's of an MRAM device 100. The opaque material layer 124 substantially conforms to the topography of the second alignment marks 140, forming visually and/or optically detectable depressions 128 in the opaque material layer 124, as shown. The opaque material layer 124 may comprise a first magnetic layer, a tunnel barrier disposed over the first magnetic layer, and a second magnetic layer disposed over the tunnel barrier, wherein the second magnetic layer comprises an opaque material, for example. The opaque material layer 124 may include a hard mask disposed over a second magnetic layer, for example, not shown. The hard mask of the opaque material layer 124 may comprise an opaque, transparent, or translucent material, for example. In semiconductor devices other than MRAM's, the opaque material layer 124 may comprise other opaque materials, for example.

Figure 5:
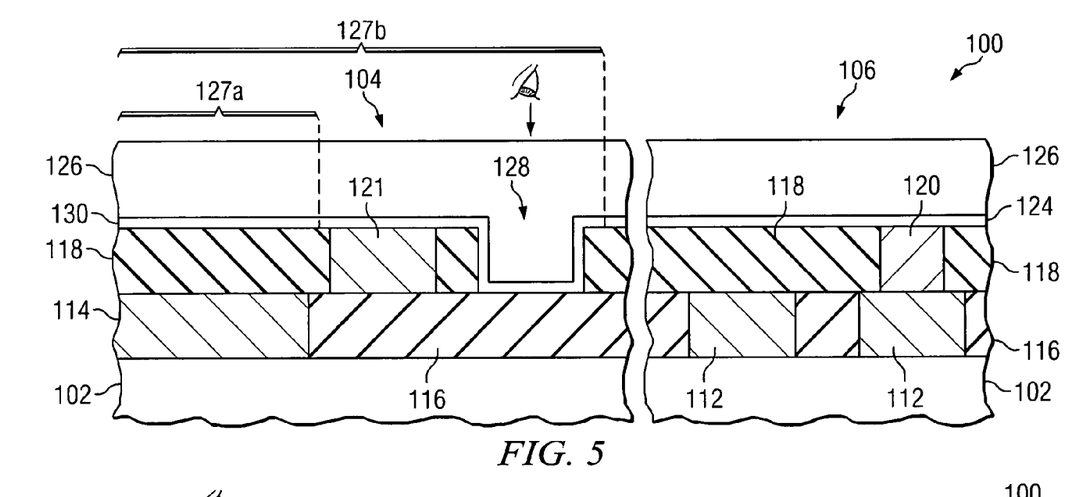
FIGS. 5 through 8 show cross-sectional views of an MRAM device at various stages of manufacturing in accordance with a preferred embodiment of the present invention.

A first masking layer 126 may be deposited over the opaque material layer 124, as shown in FIG. 5. The first masking layer 126 comprises a translucent or transparent material so that the depressions 128 in the opaque material layer 124 are optically visible by the lithography tools used to pattern the first masking layer 126. The first masking layer 126 may comprise a photoresist, a hard mask and a photoresist, or other materials and a photoresist, as examples, although alternatively, the first masking layer 126 may comprise other materials. If the first masking layer 126 comprises a hard mask material, the hard mask may comprise a dielectric material such as an oxide or nitride, as examples. As an example, the first masking layer 126 may comprise one or more hard mask material layers covered by a layer of photoresist. The photoresist may be used to pattern the hard mask, and the hard mask and optionally, also the photoresist may then be used to open the opaque material layer 124 in the alignment mark region 104.

Embodiments of the present invention provide means to align the first masking layer 126 that allows the removal of opaque material layers 124 over 114 marks. The first masking layer 126 is patterned (e.g., using a lithography mask or direct patterning method) to remove the first masking layer 126 in at least the region 127a in FIG. 5 over the at least one first alignment mark 114 in the metallization layer M1, as shown in phantom, to open a window in the first masking layer 126 at least over the at least one first alignment mark 114. The lithography mask or tool used to pattern the first masking layer 126 aligns to the depressions 128 in the opaque material layer 124 which are visible through the first masking layer 126. Region 127a may comprise a window that is slightly larger than the first alignment mark 114 pattern, for example. Alternatively, larger portions 127b of the alignment mark region 104 may be opened, revealing the optional third alignment mark 121 and/or second alignment mark 140, also shown in phantom.

Figure 6:
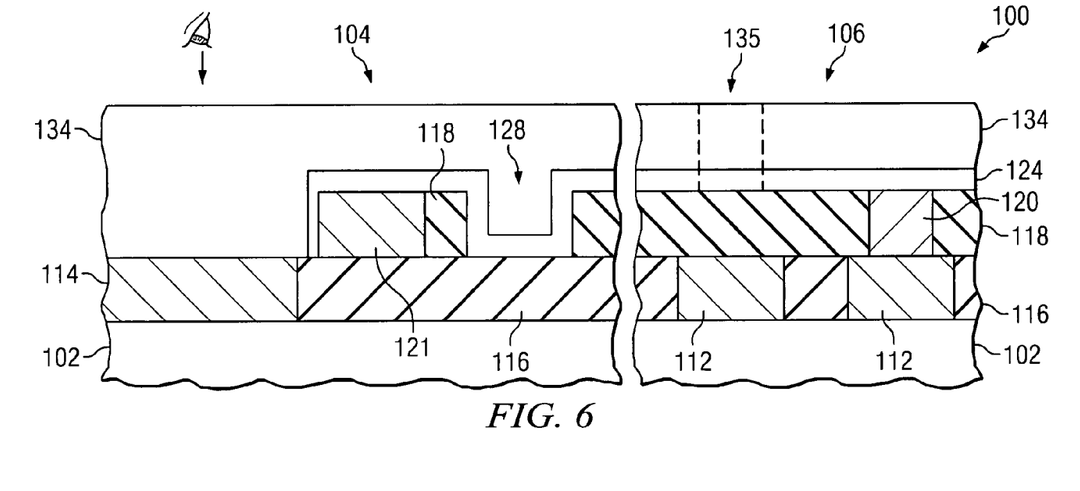

Advantageously, the depression 128 in the opaque material layer 124 is used to align the lithography mask or tool used to pattern the first masking layer 126 over the opaque material layer 124. The first masking layer 126 is then used as a mask while exposed portions of the opaque material layer 124 over at least the first alignment mark 114 are removed. The second insulating layer 118 may also be removed from over at least the first alignment marks 114, as shown in FIG. 6. The first masking layer 126 is then removed, leaving the opaque material layer 124 remaining in the array region 106 and at least partially etched away (e.g., at least over the first alignment marks 114) in the alignment mark region 104. The first alignment marks 114 are now visible, and the remainder of the workpiece 102 (e.g., the array region 106) remains covered by the opaque material layer 124.

A second masking layer 134 is then deposited over the opaque material layer 124 and the at least one first alignment mark 114, also shown in FIG. 6. The second masking layer 134 comprises a translucent or transparent material so that the at least one first alignment mark 114 in the M1 layer is optically visible by the lithography tools used to pattern the second masking layer 134. The second masking layer 134 may comprise a photoresist, a hard mask and a photoresist, or a combination of other materials and a photoresist, as examples, although alternatively, the second masking layer 134 may comprise other materials. If the second masking layer 134 comprises a hard mask material, the hard mask may comprise a dielectric material such as an oxide or nitride, as examples. The second masking layer 134 may comprise one or more hard mask material layers covered by a layer of photoresist. For example, the photoresist may be used to pattern the hard mask, and the hard mask and optionally, also the photoresist may then be used to pattern the opaque material layer 124.

Figure 7:
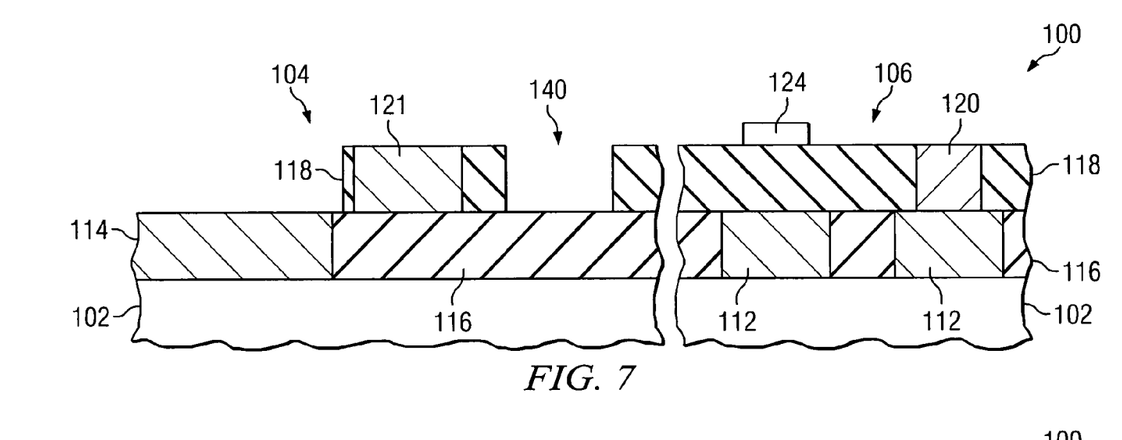

The second masking layer 134 is then patterned with the desired pattern for the opaque material layer 124 (e.g., using a lithography mask or direct patterning method), using the first alignment mark 114 of the first metallization layer MI for alignment, shown in phantom in FIG. 6. For example, if the opaque material layer 124 comprises a magnetic stack, the second masking layer 134 is patterned with the desired pattern 135 (shown in phantom) of the MTJ's, with each MTJ being disposed over a conductive line 112 formed within the first insulating layer 116. The second masking layer 134 is then used as a mask while the opaque material layer 124 is patterned, leaving the opaque material layer 124 remaining in desired portions of the array region 106, as shown in FIG. 7. The second masking layer 134 is then removed.

Figure 8:
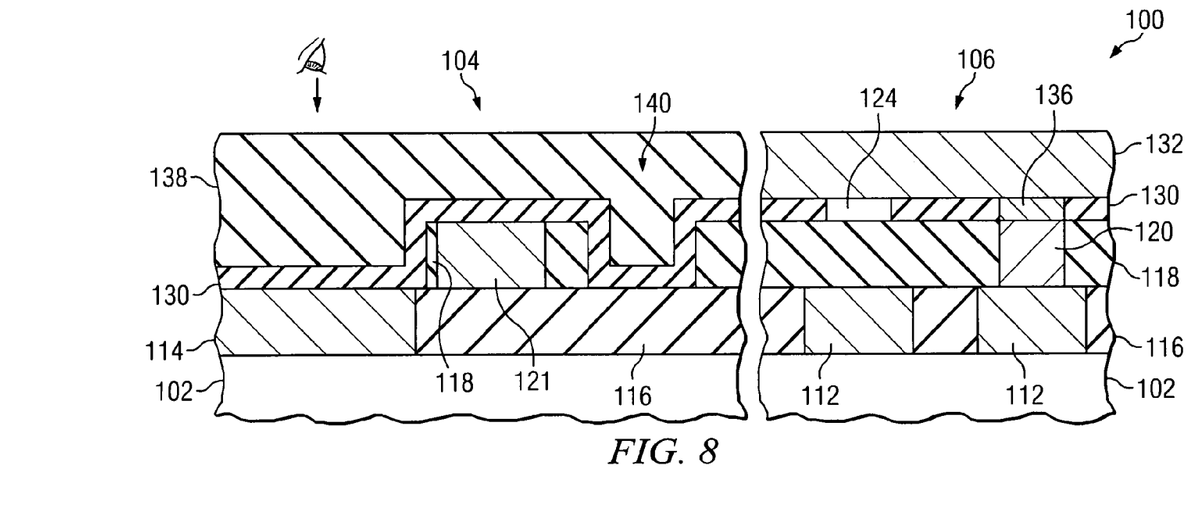

The manufacturing process for the semiconductor device 100 is then continued, as shown in FIG. 8. For example, a third insulating layer 130 comprising similar materials as described for the first insulating layer 116 and the second insulating layer 118 may be formed between the MTJ's 124 or patterned opaque material. Additional material layers 132 and 138 may be formed over the MTJ's 124 and the third insulating layer 130, as shown. For example, second conductive lines 130 positioned in a different direction than the first conductive lines 112 may be formed in a fourth insulating layer 138 comprising similar materials as described for the first insulating layer 116 and the second insulating layer 118, to form an MRAM array. The second conductive lines 130 may comprise similar materials and dimensions as described for the first conductive lines 112, for example.

The MRAM array may comprise a cross-point array, or a field effect transistor (FET) array, as examples. A conductive strap may be formed electrically coupling the bottom of the MTJ's 124 to an underlying first conductive line 112, not shown. A conductive via 136 may be formed between conductive via 120 and second conductive line 132, to make electrical contact to the workpiece 102, as shown.

Advantageously, the novel processing scheme described herein provides an integration scheme for forming second alignment marks 140 in a via layer V1 that may be used for alignment when opening the opaque material layer 124 over the first alignment marks 114 in the alignment mark region 104, so that the first alignment marks 114 may be used for the patterning of the opaque material layer 124 in the array region 106. This is particularly advantageous in applications where alignment to underlying structures is important in the manufacturing process, such as in the manufacturing process of an MRAM device, where the alignment of an MTJ 124 to a first conductive line 112 is critical, for example. Because the second alignment marks 140 formed in the via level V1 are not exposed to a CMP process and/or because they extend substantially into the via dielectric (second insulating layer 118), the depressions 128 in the opaque material layer 124 are clearly optically visible by lithography tools from the top surface of the workpiece 102 through the first masking layer 126. Therefore, excellent alignment of the MTJ's 124 to underlying first conductive lines 112 is achieved in accordance with embodiments of the present invention.

Another advantage of the novel second alignment marks 140 of the present invention is that the at least one second alignment mark 140 may be used to pattern two or more opaque material layers such as opaque material layer 124 shown in the figures and described herein. For example, an MTJ comprising two or more magnetic stack layers may be formed in accordance with embodiments of the present invention. After the opaque material layer 124 is patterned in the array region 106, as shown in FIG. 7, an additional opaque material layer (not shown) may be deposited over the patterned MTJ 124 or other structure comprising the opaque material layer 124, and also over the top surface of the second insulating layer 118 and the top surface of the conductive via 120 and optional third alignment mark 121 in the via layer V1. A third masking layer may be deposited over the additional opaque material layer, and the third masking layer may be patterned using depressions formed in the additional opaque material layer over the second alignment marks 140 for alignment. The third masking layer is then used as a mask while the additional opaque material layer is removed from over the first alignment marks 114 in the metallization layer M1. (The manufacturing process using the first masking layer 126 to open opaque material layer 124 shown in FIGS. 5 and 6 is repeated for the additional opaque material layer). Likewise, a fourth masking layer is then deposited over the structure 100, and the fourth masking layer is patterned, using the first alignment marks 114 in the metallization layer M1 for alignment. The fourth masking layer is then used to pattern the additional opaque material layer, forming a second MTJ over the first MTJ 124 shown in FIG. 7. (The manufacturing process using the second masking layer 134 to pattern opaque material layer 124 shown in FIGS. 5 and 6 is repeated for the additional opaque material layer).

One or more additional opaque material layers may be deposited and patterned using this two-step process, aligning the first mask to depressions formed in the additional opaque material layers over the second alignment marks 140 while removing the opaque material from over the first alignment marks 114, and then aligning the second mask to the first alignment marks 114 themselves. An MRAM device having two or more magnetic stacks disposed on top of one another may be manufactured in accordance with this embodiment of the invention.

Note that while the novel second alignment marks 140 described herein are shown formed in region 104 of the workpiece 102, the second alignment marks 140 may also be formed in other areas of the workpiece 102 (not shown). For example, the second alignment marks 140 may be formed in unused areas of the array region 106 of a die 100, or in unused areas of a peripheral region 105 of a die 100 (see FIG. 4B).

Embodiments of the present invention include processing schemes for patterning opaque material layers, and also a semiconductor device structure having novel alignment marks formed in one or more insulating layers of a semiconductor device. Referring to FIG. 2, the novel structure of a semiconductor device 100 includes a workpiece 102, the workpiece 102 including a first region 104 and a second region 106. A first insulating layer 116 is disposed over the workpiece 102, and at least one first alignment mark 114 is disposed over the first region 104 of the workpiece 102, and a plurality of first conductive lines 112 are disposed over the second region 104 of the workpiece 102 within the first insulating layer 116. The at least one first alignment mark 114 is filled with a conductive material. A second insulating layer 118 is disposed over the at least one first alignment mark 114, the plurality of first conductive lines 112, and the first insulating layer 116. At least one second alignment mark 140 is disposed within the second insulating layer 118 and a portion of the first insulating layer 116 over the first region 104 of the workpiece 102, as shown at $d_3$. The at least one second alignment mark 140 comprises a trench having a bottom and sidewalls.

Advantages of embodiments of the invention include providing improved alignment of opaque material layers 124 to underlying components such as conductive lines 112. The second alignment marks 140 are formed using a separate lithography mask than the mask used to pattern conductive vias 120 within the second insulating layer 118, and the second alignment marks 140 preferably have a greater length than the vias 120 formed in the via layer in one embodiment. The second alignment marks 140 are not exposed to a CMP process and they are not filled with a material, and thus the topography of the alignment marks 140 remains intact and is sharp and clear, so that the alignment marks 140 may be used to align the patterning of a subsequently deposited opaque material layer 124, such as a magnetic stack of an MTJ 124. Because the depressions 128 comprise a clear pattern, the window size of the mask 126 used to open the first alignment marks 114 may be made smaller, saving surface area in the alignment mark region 104 on the kerf of the semiconductor die 100. The second alignment marks 140 allow the patterning of opaque material layers 124 in the absence of any surface topography of the underlying layers.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, comprising:

providing a workpiece, the workplace including a first region and a second region;

forming a first insulating layer over the workplace;

forming at least one first alignment mark over the first region of the workpiece and a plurality of first conductive lines over the second region of the workpiece within the first insulating layer, the at least one first alignment mark being filled with a conductive material;

forming a second insulating layer over the at least one first alignment mark, the plurality of first conductive lines, and the first insulating layer;

forming a conductive via in the second insulating layer over the second region of the workpiece using a first lithography mask;

forming at least one second alignment mark within at least the second insulating layer over the first region of the workpiece using a second lithography mask, the second lithography mask being different from the first lithography mask, the at least one second alignment mark comprising a trench having a bottom and sidewalls;

depositing an opaque material layer over the at least one second alignment mark and the second insulating layer, the opaque material layer lining the bottom and sidewalls of the trench of the at least one second alignment mark, leaving a depression in the opaque material layer over each at least one second alignment mark;

depositing a first masking layer over the opaque material layer;

patterning the first masking layer using a lithography mask or tool, removing the first masking layer from over the at least one first alignment mark, using the depression over the at least one second alignment mark to align the lithography mask or tool used to pattern the first masking layer over the opaque material layer;

removing the opaque material layer from over the at least one first alignment mark using the first masking layer as a mask;

removing the first masking layer;

depositing a second masking layer over the opaque material layer and the at least one first alignment mark;

patterning the second masking layer with a pattern for the opaque material layer using the at least one first alignment mark for alignment; and patterning the opaque material layer using the second masking layer as a mask.

2. The method according to claim 1, wherein the first masking layer or the second masking layer comprise a photoresist, or a hard mask and a photoresist.

3. The method according to claim 1, wherein forming the conductive via further comprises forming at least one third alignment mark in the second insulating layer over the first region of the workpiece, wherein the conductive via, the second insulating layer and the at least one third alignment mark comprise a substantially planar top surface.

4. The method according to claim 1, wherein forming the at least one second alignment mark comprises forming at least one set of second alignment marks.

5. The method according to claim 4, wherein the first region and the second region of the semiconductor device comprise one of a plurality of die on the semiconductor workpiece, each die having a top edge, a bottom edge, a first side edge, and a second side edge opposite the first side edge, wherein fanning the at least one set of second alignment marks comprises fanning a first set of second alignment marks along the top edge or bottom edge of the die, and forming a second set of second alignment marks along the first side edge or the second side edge of the die.

6. The method according to claim 5, wherein forming the second alignment marks comprises forming second alignment marks having a width of about 2 μm or less and a length of about 60 μm or less.

7. The method according to claim 5, wherein the first set of second alignment marks comprises about 10 or more second alignment marks, and wherein the second set of alignment marks comprises about 10 or more second alignment marks.

8. The method according to claim 1, wherein forming the at least one second alignment mark within at least the second insulating layer comprises forming the at least one second alignment mark in at least about half the thickness of the second insulating layer.

9. The method according to claim 8, wherein forming the at least one second alignment mark within at least the second insulating layer comprises forming the at least one second alignment mark in the entire thickness of the second insulating layer.

10. The method according to claim 9, wherein forming the at least one second alignment mark further comprises forming the at least one second alignment mark within at least a portion of the first insulating layer.

11. The method according to claim 1, wherein forming the at least one second alignment mark comprises forming the at least one second alignment mark having a depth of about 1000 Angstroms or more.

12. The method according to claim 1, wherein forming the at least one second alignment mark comprises forming the at least one second alignment mark over the first region of the workpiece yet not disposed over one of the plurality of first alignment marks in the first region of the workpiece.

13. The method according to claim 1, wherein the first region comprises a kerf or edge region of a die of the semiconductor device.

14. The method according to claim 1, wherein the semiconductor device comprises a magnetic random access memory (MRAM) device, wherein the first region comprises a kerf or edge region of a die of the MRAM device, wherein the second region comprises an array region of the MRAM device, wherein the depositing the opaque material layer comprises depositing a first magnetic stack, and wherein patterning the opaque material layer comprises forming at least one magnetic tunnel junction (MTJ).

15. The method according to claim 14, further comprising:

depositing a second magnetic stack over at least the MTJ, the second magnetic stack comprising an opaque material;

depositing a third masking layer over the second magnetic stack;

patterning the third masking layer using a lithography mask or tool, using the depression over the at least one second alignment mark to align the lithography mask or tool used to pattern the second masking layer over the second magnetic stack;

removing the second magnetic stack from over the at least one first alignment mark using the third masking layer as a mask;

removing the third masking layer;

depositing a fourth masking layer over the second magnetic stack and the at least one first alignment mark;

at least one first alignment mark for alignment; and patterning the second magnetic stack using the fourth masking layer as a mask.

16. The method according to claim 14, further comprising forming a plurality of second conductive lines over each at least one MTJ.

17. The method according to claim 14, wherein the first magnetic stack comprises a first magnetic layer, a tunnel barrier disposed over the first magnetic layer, and a second magnetic layer disposed over the tunnel barrier, wherein at least the second magnetic layer comprises an opaque material.

18. A method of manufacturing a magnetic memory device, comprising:

providing a workpiece, the workplace including a plurality of die regions, each die region comprising an alignment mark region at the edges thereof, and an array region disposed within the alignment mark region;

forming a first insulating layer over the workpiece;

forming at least one first alignment mark over the alignment mark region of the workpiece and a plurality of first conductive lines over the array region of the workpiece within the first insulating layer, the at least one first alignment mark being filled wit a conductive material;

forming a second insulating layer over the at least one first alignment mark, the plurality of first conductive lines, and the first insulating layer;

forming a conductive via in the second insulating layer over the array region of the workpiece using a first lithography mask;

forming at least one second alignment mark within at least the second insulating layer over the alignment mark region of the workpiece using a second lithography mask, the second lithography mask being different from the first lithography mask, the at least one second alignment mark comprising a trench having a bottom and sidewalls, the at least one second alignment mark not being disposed over the at least one first alignment mark;

depositing a first magnetic stack over the at least one second alignment mark mid the second insulating layer, the first magnetic stack lining the bottom and sidewalls of the trench of the at least one second alignment mark, leaving a depression in the first magnetic stack over the at least one second alignment mark;

depositing a first masking layer over the first magnetic stack;

patterning the first masking layer using a lithography mask or tool, removing the first masking layer from over the at least one first alignment mark, using the depression over the at least one second alignment mark to align the lithography mask or tool used to pattern the first masking layer over the first magnetic stack;

removing the first magnetic stack from over the at least one first alignment mark using the first masking layer as a mask;

removing the first masking layer;

depositing a second masking layer over the first magnetic stack and the at least one first alignment mark;

patterning the second masking layer with a pattern for the first magnetic stack using the at least one first alignment mark for alignment; and patterning the first magnetic stack using the second masking layer as a mask.

19. The method according to claim 18, wherein the first masking layer or the second masking layer comprise a photoresist, or a hard mask and a photoresist.

20. The method according to claim 18, wherein forming the conductive via further comprises forming at least one third alignment mark in the second insulating layer over the alignment mark region of the workpiece, wherein the conductive via, the second insulating layer and the at least one third alignment mark comprise a substantially planar top surface.

21. The method according to claim 18, wherein forming the at least one second alignment mark comprises forming at least one set of second alignment marks.

22. The method according to claim 21, wherein the alignment mark region comprises a top edge, a bottom edge, a first side edge, and a second side edge opposite the first side edge, wherein forming the at least one set of second alignment marks comprises forming a first set of second alignment marks along the top edge or bottom edge of the alignment mark region, and forming a second set of second alignment marks along the first side edge or the second side edge of the alignment mark region.

23. The method according to claim 22, wherein the second alignment marks comprise a width of about 2 μm or less and a length of about 60 μm or less.

24. The method according to claim 22, wherein the first set of second alignment marks comprises about 10 or more second alignment marks, and wherein the second set of alignment marks comprises about 10 or more second alignment marks.

25. The method according to claim 18, wherein forming the at least one second alignment mark within at least the second insulating layer comprises forming the at least one second alignment mark in at least about half the thickness of the second insulating layer.

26. The method according to claim 25, wherein forming the at least one second alignment mark within at least the second insulating layer comprises forming the at least one second alignment mark in the entire thickness of the second insulating layer.

27. The method according to claim 26, wherein forming the at least one second alignment mark further comprises forming the at least one second alignment mark within at least a portion of the first insulating layer.

28. The method according to claim 18, wherein forming the at least one second alignment mark comprises forming the at least one second alignment mark having a depth of about 1000 Angstroms or more.

29. The method according to claim 18, wherein the magnetic memory device comprises a magnetic random access memory (MRAM) device, and wherein patterning the first magnetic stack comprises forming at least one magnetic tunnel junction (MTJ).

30. The method according to claim 29, further comprising:
depositing a second magnetic stack over at least the MTJ, the second magnetic stack comprising an opaque material;
depositing a third masking layer over the second magnetic stack;
patterning the third masking layer using a lithography mask or tool, using the depression over the at least one second alignment mark to align the lithography mask or tool used to pattern the second masking layer over the second magnetic stack;
removing the second magnetic stack from over the at least one first alignment mark using the third masking layer as a mask;
removing the third masking layer;
depositing a fourth masking layer over the second magnetic stack and the at least one first alignment mark;
patterning the fourth masking layer with a pattern for the second magnetic stack using the at least one first alignment mark for alignment; and
patterning the second magnetic stack using the fourth masking layer as a mask.

31. The method according to claim 29, further comprising forming a plurality of second conductive lines over each at least one MTJ.

32. The method according to claim 29, wherein the first magnetic stack comprises a first magnetic layer, a tunnel barrier disposed over the first magnetic layer, and a second magnetic layer disposed over the tunnel barrier, wherein at least the second magnetic layer comprises an opaque material.

33. A semiconductor device, comprising:
a workpiece, The workpiece including a first region and a second region;
a first insulating layer disposed over the workpiece;
at least one first alignment mark disposed over the first region of the workpiece and a plurality of first conductive lines disposed over the second region of the workpiece within the first insulating layer, the at least one first alignment mark being filled with a conductive material;
a second insulating layer disposed over the at least one first alignment mark, the plurality of first conductive lines, and the first insulating layer;
at least one second alignment mark disposed within the second insulating layer and a portion of the first insulating layer over the first region of the workpiece, the at least one second alignment mark comprising a trench having a bottom and sidewalls; and
an opaque material layer disposed over the second insulating layer, and over the at least one second alignment mark, the opaque material layer lining the bottom and sidewalls of the trench of the second alignment mark, leaving a depression in the opaque material layer over the second alignment mark.

34. The semiconductor device according to claim 33, wherein the semiconductor device comprises a magnetic random access memory (MRAM) device, wherein the first region comprises a kerf or edge region of a die of the MRAM device, wherein the second region comprises an array region of the MRAM device.

* * * * *

UNITED STATES PATENT AND TRADEMARK OFFICE
CERTIFICATE OF CORRECTION

PATENT NO. : 7,223,612 B2 Page 1 of 1
APPLICATION NO. : 10/899253
DATED : May 29, 2007
INVENTOR(S) : Sarma It is certified that error appears in the above-identified patent and that said Letters Patent is hereby corrected as shown below:

Column 15, line 26; delete "fanning" insert --forming--
Column 15, line 27; delete "fanning" insert --forming--
Column 17, line 2; delete "mark mid" insert --mark--
Column 18, line 45; delete "The" insert --the--

Signed and Sealed this

Seventh Day of August, 2007

JON W. DUDAS
*Director of the United States Patent and Trademark Office*